(12) United States Patent
Houlihan et al.

(10) Patent No.: US 6,342,431 B2
(45) Date of Patent: *Jan. 29, 2002

(54) METHOD FOR ELIMINATING TRANSFER GATE SACRIFICIAL OXIDE

(75) Inventors: Kevin M. Houlihan; Jed H. Rankin, both of Burlington, VT (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/173,089

(22) Filed: Oct. 14, 1998

(51) Int. Cl.[7] .................................... H01L 21/8238
(52) U.S. Cl. .................. 438/433; 438/294; 438/297; 438/296; 438/449
(58) Field of Search .................. 438/223, 221, 438/197, 296, 424, 514, 433, 449, 294, 297, FOR 227; 148/DIG. 50

(56) References Cited

U.S. PATENT DOCUMENTS

| | | | |
|---|---|---|---|
| 5,151,381 A | 9/1992 | Liu et al. | |
| 5,290,718 A | 3/1994 | Fearon et al. | |
| 5,389,559 A | 2/1995 | Hsieh et al. | |
| 5,474,944 A | 12/1995 | Zambrano | |
| 5,492,858 A | 2/1996 | Bose et al. | |
| 5,573,974 A | 11/1996 | Hwang | |
| 5,623,153 A | 4/1997 | Liang et al. | |
| 5,661,072 A | 8/1997 | Jeng | |
| 5,674,776 A | 10/1997 | Mathews et al. | |
| 5,990,525 A | * 11/1999 | Liao | |
| 6,040,231 A | * 3/2000 | Wu | |

* cited by examiner

Primary Examiner—George Fourson
Assistant Examiner—Michelle Estrada
(74) Attorney, Agent, or Firm—William D. Sabo, Esq.; McGinn & Gibb, PLLC

(57) ABSTRACT

A method of forming a semiconductor device, includes forming a layer of oxide on a semiconductor substrate, forming a layer of silicon nitride on the oxide layer, forming isolation regions in the substrate using the oxide layer and the nitride layer, removing the silicon nitride layer, ion implanting dopant ions using the original oxide layer as a screen, into the substrate, and removing the oxide layer and forming a gate oxide layer over the substrate. Another method of forming an active area of a semiconductor device, includes using a pad oxide, remaining after removing a film layer thereover of an oxide/film mask stack, for a screen layer for well implants formed in the substrate, removing the oxide layer and forming a gate oxide over the substrate, following defining the well implants, without using a sacrificial oxide.

20 Claims, 6 Drawing Sheets

METHOD FOR ELIMINATING TRANSFER GATE SACRIFICIAL OXIDE

BACKGROUND OF THE INVENTION

1. Field of the Invention

The present invention relates to a method of forming a semiconductor device, and more particularly to a method of fabrication, which eliminates the need for transfer gate sacrificial oxide, thereby reducing the number of process steps in forming metal oxide semiconductor field effect transistors (MOSFETs), improving corner device leakages, reducing process defects, and loss of isolation insulator material.

2. Description of the Related Art

In processing a logic wafer, the initial step is forming an oxide (e.g., typically referred to as a "pad oxide"), and thereafter depositing a silicon nitride layer (e.g., typically referred to as a "pad nitride"), creating an isolation feature (e.g., a shallow trench isolation, but equally relevant to a field oxide isolation or other means of isolation), and filling the trench with insulator material.

Next, the pad nitride is stripped, typically using a hot phosphoric etch, followed by a hydrofluoric acid (HF) dip, or any oxide removing fluid to remove the pad oxide underneath. After the pad films are removed, a transfer gate sacrificial oxide (e.g., a "TG Sac Ox") is grown to serve as a barrier film, between the Si surface and photoresist, as well as to reduce implant damage during ion implantation. Additionally, the thickness of this sacrificial oxide film is crucial for the threshold voltage control of the MOSFETs.

Finally, after the logic wells are implanted, the TG Sac Ox is stripped using an oxide etchant, and the silicon surface is exposed and cleaned for gate oxide growth.

However, the above-described conventional method is problematic because the combination of these isotropic wet etches for removing the pad nitride, pad oxide, and TG Sac Ox consumes isolation oxides. In STI isolation, the weak points in the TEOS fill create problems for subsequent processing when exposed during prior processing.

For example, trench isolation wafers (e.g., STI) are scrapped for defects called "seams", which also cause polysilicon-polysilicon features to short electrically. In high aspect ratio isolation trenches, a filling void occurs during the trench fill process which, if exposed to wet etches (particularly oxide etches), creates an indentation in which the seams defect can form. Thus, additional stripping steps result in high product costs due to defective parts. Field oxide isolation processing also has certain defects associated therewith including oxide consumption, leakage, poor insulation and a "corner device".

The thermal oxide isotropic etches are particularly harmful for causing the isolation pull-down, the "seam", and "divot". The divot occurs at a corner of the trench because the wet etches are isotropic, thereby etching laterally and vertically as opposed to the center of the trench, where the directional attack causes "pulldown". As a result, the divots are formed at corners of the trench fill which creates later processing problems by making the surface of the wafer less planar.

The non-planar wafer surface causes photolithography problems, film uniformity issues, and increases the risk of process defects such as PC-PC shorts, or entrapment of foreign material.

SUMMARY OF THE INVENTION

In view of the foregoing and other problems of the conventional methods, it is an object of the present invention to provide a method for forming a semiconductor device, in which the transfer gate sacrificial oxide (and resulting step to remove such an oxide) is not required, thereby reducing the number of manufacturing steps, costs, and simultaneously reducing isolation divot/pull-down and associated defects described above.

In a first aspect of the present invention, a method of forming a semiconductor device is provided, which includes steps of forming an oxide layer on a semiconductor substrate, forming a silicon nitride layer on the oxide layer, forming isolation regions in the substrate (e.g., using one lithographic mask and etching through the nitride layer and oxide layer into the substrate), removing the silicon nitride layer, ion implanting dopant ions, while using the initial oxide layer as a screening layer, removing the oxide layer, and forming a gate oxide layer over the semiconductor substrate.

In a second aspect of the present invention, a method for forming an active area of a semiconductor device, is provided which includes steps of defining isolation regions in a substrate, using a pad oxide, left after removing a nitride layer of an oxide/nitride mask stack, for a barrier layer for ion implants formed in the substrate, and forming a gate oxide over the substrate, following defining the isolation regions, implants, and removal of pad oxide, without using a traditionally formed transfer gate sacrificial oxide and without stripping the transfer gate sacrificial oxide.

In a third aspect of the present invention, a method for forming an active area of a semiconductor device, includes using a pad oxide, remaining after removing a film layer thereover of an oxide/film mask stack, for a screen layer for ion implants formed in the substrate, and forming a gate oxide over the substrate, following defining the well implants and stripping pad oxide, without using a sacrificial oxide.

With the unique and unobvious aspects and features of the present invention, the transfer gate sacrificial oxide is eliminated, unlike the conventional process, as described above.

An important feature of the process of the present invention is that the oxide is used in the isolation pad films as the barrier film for the well implants. Using a selective hot phosphoric pad nitride etch or a chemical downstream etch (CDE), the remaining pad oxide can be controlled to the desired thickness for the CMOS device well implants. Specifically, the pad nitride can be removed, leaving a well-controlled, uniform amount of oxide, to be used as an implant screen.

With the invention, an entire oxide strip step is eliminated, which reduces the removal of the isolation fill feature (especially thermal oxide etches). Excessive oxide removals can damage the substrate surface, degrade the gate integrity/reliability, and cause defects, thereby creating complications during subsequent processing.

The present invention also improves seams, polysilicon-to-polysilicon shorts yields, reduces the corner device leakage, and rounds the corners of the trench isolations, all of which have significant MOSFET performance implications.

BRIEF DESCRIPTION OF THE DRAWINGS

The foregoing and other objects, aspects and advantages will be better understood from the following detailed description of a preferred embodiment of the invention with reference to the drawings, in which:

FIG. 1 illustrates a step of forming isolations 4 in substrate 1 having a pad oxide 2 and a pad nitride 3 thereover, respectively;

FIG. 2 illustrates a step of removing the pad nitride 3 from the top of the pad oxide 2 from the original films stack;

FIG. 3 illustrates a step of forming photoresist block level masks 5 for forming N-well implants;

FIG. 4 illustrates a step of stripping the photoresist block level masks 5 used for forming the N-well implants;

FIG. 5 illustrates a step of forming photoresist block level masks 7 for forming P-well implants;

FIG. 6 illustrates a step of stripping the photoresist block level masks 7 for forming the P-well implants;

FIG. 7 illustrates stripping of the pad oxide 2, and the divots that are inadvertently produced;

FIG. 8 illustrates a step of forming a gate oxide 9 over the silicon substrate 1;

FIG. 9 illustrates a step of depositing polysilicon and a mask for defining and forming a gate for the semiconductor device;

DETAILED DESCRIPTION OF A PREFERRED EMBODIMENT OF THE INVENTION

Figure 11:
FIG. 11 is a transmission electron micrograph (TEM) of a wafer formed by the conventional process utilizing a transfer gate sacrificial oxide, demonstrating the sharp Si trench corners produced by the process.
Figure 12:
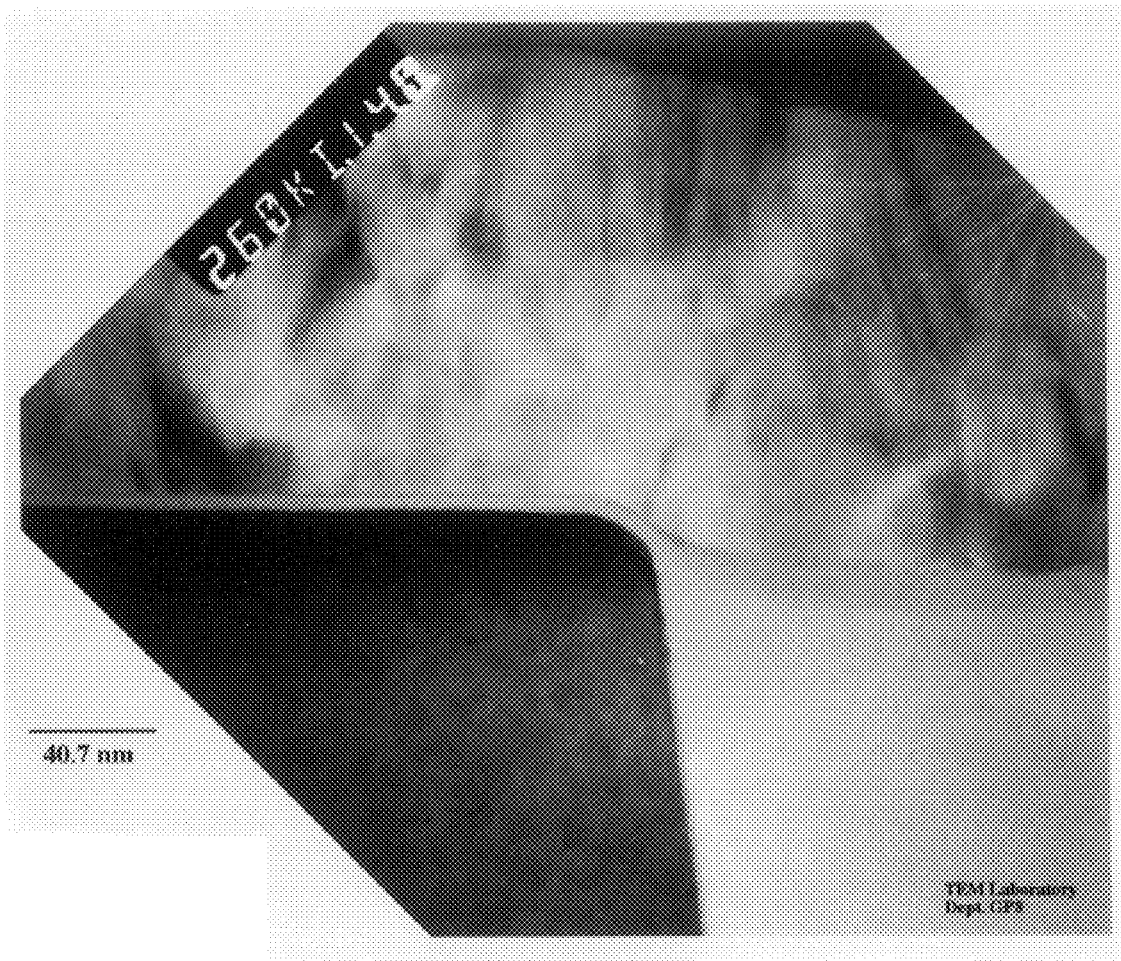
FIG. 12 is a transmission electron micrograph (TEM) of a wafer formed by the process of the present invention eliminating a transfer gate sacrificial oxide, demonstrating a rounded corner of the silicon island.

The first preferred embodiment of the present invention eliminates the transfer gate sacrificial oxide and the associated steps from the conventional process as described above. Specifically, this process uses the initial pad oxide (e.g., the oxide in an isolation pad stack) as a screen film for the well implants. For instance, if this pad oxide is beneath nitride in a stack, using a selective, well-controlled wet (e.g., hot phosphoric acid etch) or dry etch (e.g., CDE), the nitride is removed, and the pad oxide is etched to the desired thickness to perform the well ion implants. Thus, the invention eliminates an entire oxide removal step, traditionally used to expose the Si substrate before forming desired thickness screens. This invented process will reduce significantly the corner divot, trench center pulldown, and synergistically reduce the chance of exposing STI trench voids which lead to polysilicon shorts in the isolation, as shown in a comparison of FIGS. 11 and 12, with FIG. 11 showing the results of the conventional techniques, and FIG. 12 showing the results of the present invention. As shown, the divot is reduced in size when the sacrificial oxide elimination process is used according to the present invention, and the trench corner Si is rounder than the conventional processes.

Turning now to FIGS. 1–10, the process of the present invention will be described.

Figure 1:
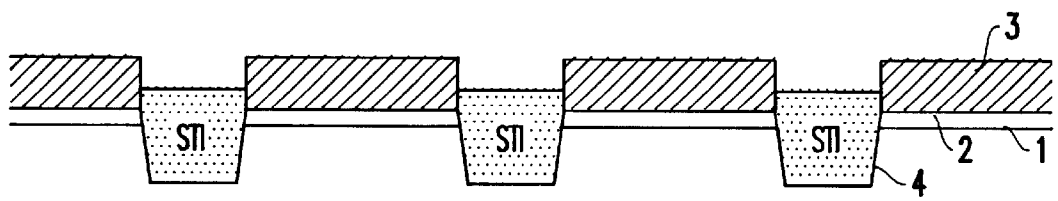
FIGS. 1–9 illustrate a method of forming a semiconductor device, such as a metal oxide semiconductor field-effect transistor (MOSFET), according to a first preferred embodiment of the present invention, and more specifically

First, as shown in FIG. 1, a silicon substrate (with or without epitaxial crystals) 1, having a thickness for example of between 0.5 mm to about 2 mm, is provided with a pad oxide 2 thereover. The pad oxide 2 may have an exemplary thickness of within a range of about 40 Å to about 100 Å, and for example, about 80 Å, but of course may have a different thickness as desired. Pad oxide 2 has a pad nitride 3 deposited/formed thereover. The pad nitride thickness preferably is between 200–2000 Å. Isolations (such as shallow trench isolations (STIs) or field oxide isolations) 4 are formed at specified intervals, as shown, by using a photoresist mask or the like. The trench isolation may be filled with insulating material (e.g., oxide TEOS, another oxide or insulator), and polished thereafter. FIG. 1 illustrates a cross-section of the manufacturing process after the isolations 4 (e.g., shallow trench isolations or field oxide isolations) are formed.

Figure 2:
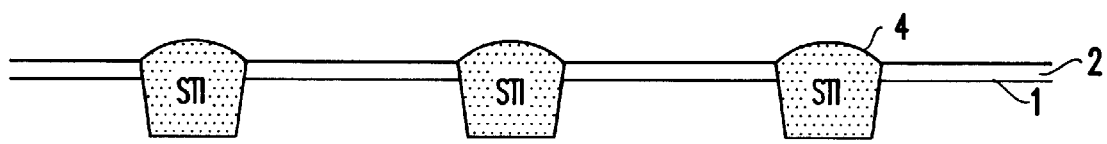

As shown in FIG. 2, the pad nitride 3 is stripped selectively to the pad oxide 2 to obtain the desired pad oxide thickness remaining. The range of desired thicknesses of the pad oxide 2 may be freely determined according to the MOSFET design constraints and requirements and thus is not limited by the present invention.

Figure 3:
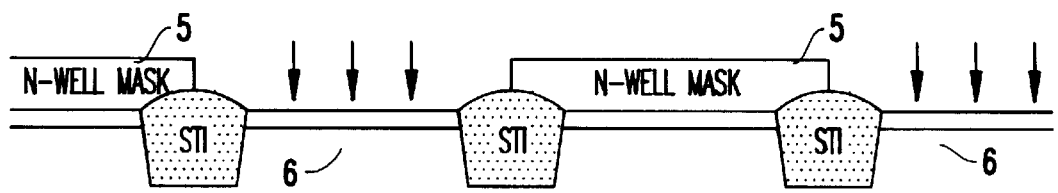

As shown in FIG. 3, a photoresist block level mask 5 is formed, for performing the N-well implants 6, in a manner well-known in the industry.

Figure 4:
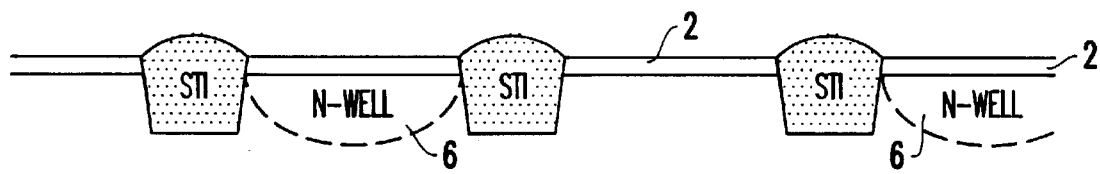
Figure 5:
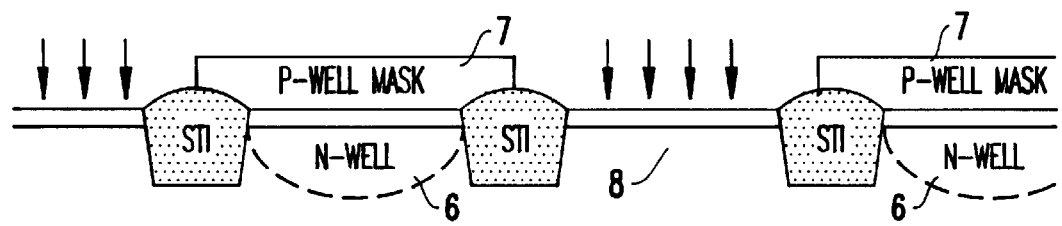

In FIG. 4, the N-well mask 5 is stripped (removed), for example, by ozone plasma, and in FIG. 5 a photoresist block level mask 7 for the P-well implants is applied and developed. Thereafter, the implants for the P-wells 8 are done.

Figure 6:
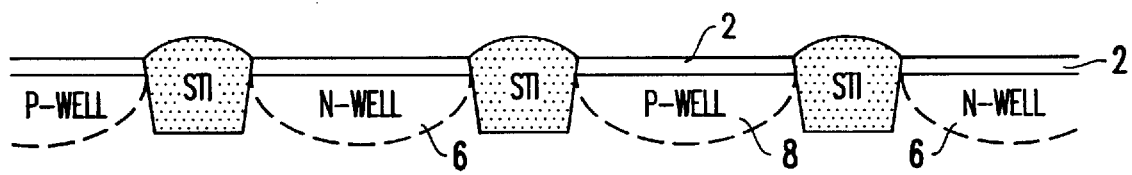

As shown in FIG. 6, the P-well mask 7 is stripped, for example, by ozone plasma, leaving the substrate with adjacent P-wells 8 separated by an N-well 6 and an isolation 4 (e.g., an STI or field oxide trench isolation). The pad oxide 2 is still present over the respective P-wells 8 and N-wells 6.

Figure 7:
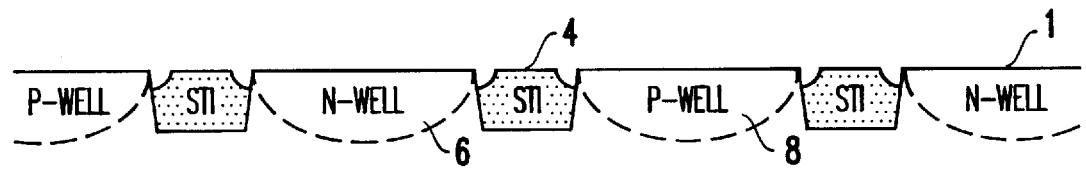

In FIG. 7, the pad oxide 2 is stripped, for example, by hydrofluoric acid or the like (e.g., use of other stripping agents may be employed), thereby leaving the silicon substrate 1 with the P-wells 8 and N-wells 6 implanted into the substrate 1. It is noted that the invention is not limited to forming the N-wells 6 first and the P-wells 8, subsequently. That is, the order of forming the N-well 6 in relation to forming the P-wells 8 is insignificant. Thus, the steps in FIGS. 3 and 5 could be interchanged or excluded.

Figure 8:
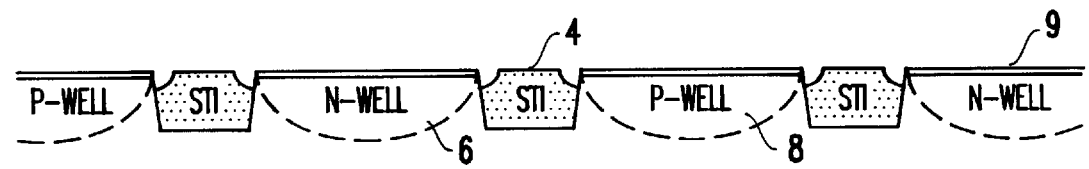

Thereafter, in FIG. 8, a gate oxide 9 is formed over the silicon substrate 1 by, for example, oxidation of the surface of the silicon substrate 1. Any oxidizing ambient may be employed in this process, and any advanced compound gate dielectrics may be used.

Figure 9:
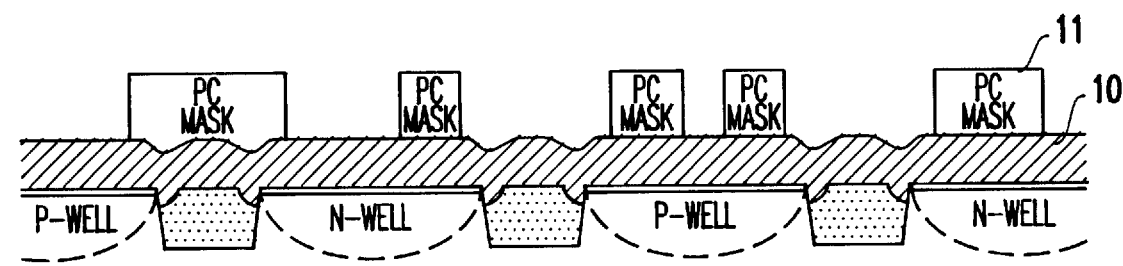

In FIG. 9, polysilicon 10 is deposited onto gate oxide 9 and is masked with a mask 11 at desired regions for forming respective gates for the device.

Figure 10:
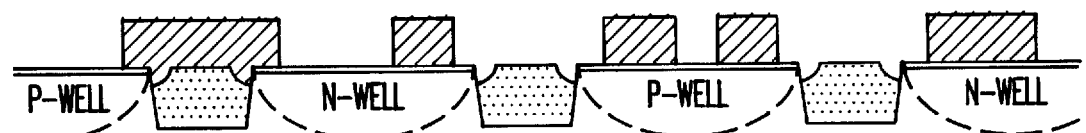
FIG. 10 illustrates a step of etching the polysilicon and removing the mask to form the semiconductor device.

In FIG. 10, the polysilicon is etched at places other than under the mask 11, thereby to form the gates for the semiconductor device (e.g., MOSFET or the like).

FIG. 11 is a transmission electron micrograph (TEM) of a wafer formed by the conventional process utilizing a transfer gate sacrificial oxide.

As shown, there are sharp corners or edges (angles) such that the silicon corners at the top of the trench isolation are beveled. As a result of these sharp angles, the oxide grown on the silicon is pinched, creating device reliability concerns.

More specifically, compressive stresses which are present reduce the oxidation growth rate, thereby nonuniformly oxidizing around the corner, and leaving a thinner oxide at the vertexes. Thus, with such sharp angled corners, thermal oxidation occurs with more compressive stress, and is less effective than uniform thicker oxides at insulating against the increased electrical field at the FET corner which activates quicker.

FIG. 12 is a transmission electron micrograph (TEM) of a wafer formed by the process of the present invention eliminating a transfer gate sacrificial oxide.

As shown, with the present invention, by eliminating the traditional sacrificial oxide strip, the corners are more rounded on top of the isolation (e.g., STI or field oxide isolation), and the sharp pinching angles are noticeably absent. As a result, the oxide growth is more uniform, thereby providing enhanced insulation and preventing corner devices from activating at undesirably low voltages.

FIG. 12 also illustrates the amount of isolation pulldown in the middle of the trench is slightly higher because of one less oxide strip.

Figure 13:
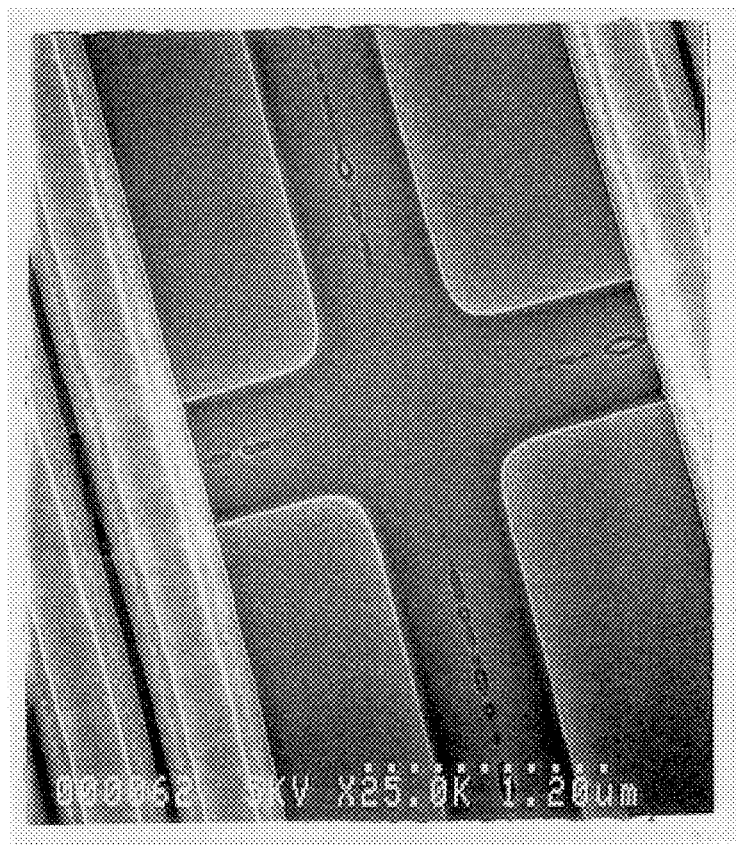
FIG. 13 is a scanning electron micrograph (SEM) of a wafer formed by the conventional process utilizing a transfer gate sacrificial oxide, demonstrating a seam.

FIG. 13 is a top-shot scanning electron micrograph (SEM) of a wafer formed by the conventional process utilizing a transfer gate sacrificial oxide. As shown, the seam in the TEOS fill is present traveling down the center of the trench isolation due to chemical removal of oxides in the conventional process. Thus, FIG. 13 shows the seam, which degrades yield, as described above.

Figure 14:
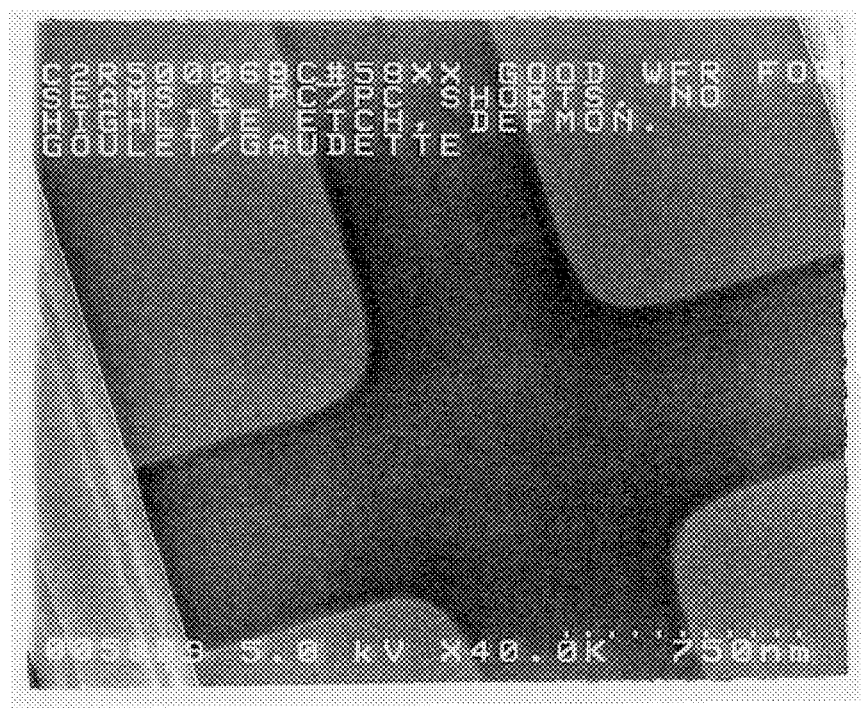
FIG. 14 is a scanning electron micrograph (SEM) of a wafer formed by the present invention eliminating a transfer gate sacrificial oxide.

In contrast, FIG. 14 is a top-shot scanning electron micrograph (SEM) of a wafer formed by the invented process eliminating a transfer gate sacrificial oxide. As shown, the exposed fill seam is not present, since a chemical wet dipping is removed from the conventional processing, and subsequently, less trench material is removed.

Figure 15:
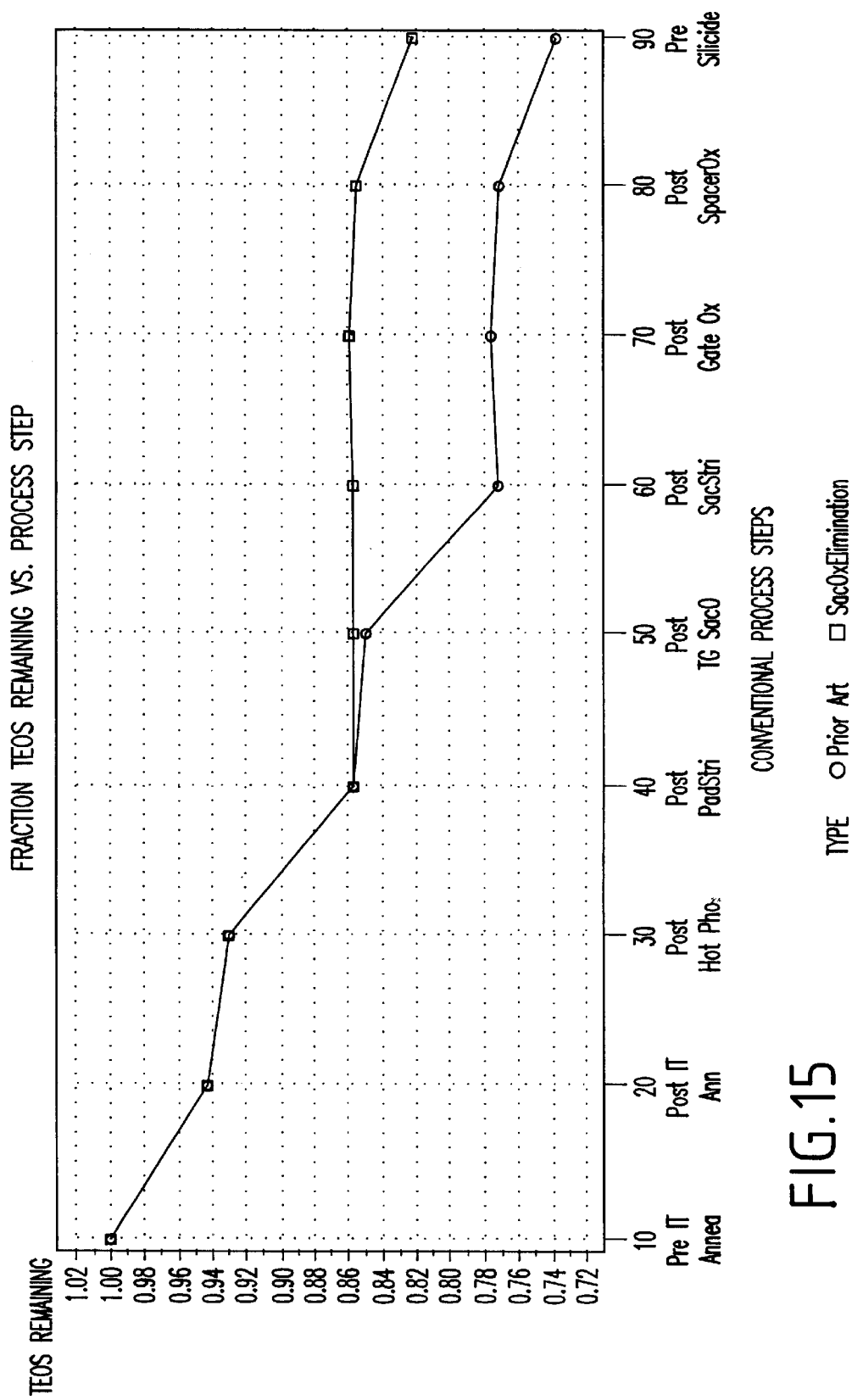
FIG. 15 is a graph illustrating the percent of STI TEOS fill remaining vs. the conventional semiconductor device processing steps for both conventional processing, and using the present invention.

FIG. 15 is a graph illustrating the % TEOS remaining through STI conventional process steps. As shown, the most detrimental conventional process steps are sacrificial oxide and pad oxide strip (e.g., 40 and 60) for loss of isolation fill (e.g., as indicated by the steep slope). The elimination of the transfer gate sacrificial oxide conserves a net average of 8 percent loss of TEOS associated with the conventional processing step (sac oxide growth and strip).

The advantages of the above-described process can be clearly seen below in which, in the present invention when there is sufficient control and monitoring of processing equipment, along with choice of film thickness (e.g., of the pad oxide), there is no need for stripping the pad oxide, and growing the desired sacrificial oxide thickness (e.g., TG sacrificial oxide). In contrast, the conventional process requires the TG sacrificial oxide and its removal, to form the FET, which incurs additional cost, processing time, defects, etc.

Hence, instead of the pad oxide strip and the sacrificial screen oxidation step in the conventional process, the process according to the present invention uses the initial pad oxide as a barrier film for the well masks and implants. Using one selective, well-controlled pad nitride etch across the entire wafer, the pad oxide thickness can be controlled to the desired thickness for uniform well implants. Specifically, in STI processing the pad nitride may be removed by a hot phosphoric etch, and then the well implants may be performed directly through the pad oxide, with out any intermediate steps of stripping the pad oxide, and growing a desired thickness oxide (e.g,. TG sacrificial oxide).

While the invention has been described in terms of a single preferred embodiment, those skilled in the art will recognize that the invention can be practiced with modification within the spirit and scope of the appended claims.

For example, as mentioned above, the isolations are not limited to any one type. Thus, the present invention is equally applicable to shallow trench isolations (STIs) as well as to field oxide isolations (FOX) or the like. As such, the present invention is transparent to STI or field oxide or the like isolation processing.

Additionally, while the present invention has been described above in the context of isolations, the isolations are not critical to the invention and thus are not necessary for the practicing the invention.

Specifically, any application in which implanting occurs through an oxide in a stack with or without an isolation would find great benefit with the present invention.

Having thus described our invention, what we claim as new and desire to secure by letters patent is as follows:

1. A method of forming a semiconductor device, comprising in the following order:

forming an oxide layer on a semiconductor substrate;

depositing a silicon nitride layer on said oxide layer;

forming isolation regions in said substrate;

removing said silicon nitride layer;

selectively etching said oxide layer to form a resulting oxide layer having a thickness corresponding to a desired threshold voltage for said semiconductor device;

implanting dopant ions, using said oxide layer as a screen, into said substrate; and removing said oxide layer and forming a gate oxide layer over said substrate.

2. The method according to claim 1, wherein said method is devoid of a transfer gate sacrificial oxide growing step.

3. The method according to claim 1, wherein said method is devoid of a transfer gate sacrificial oxide removal step.

4. The method according to claim 1, wherein said isolation regions comprise field oxide isolation regions.

5. The method according to claim 1, further comprising growing a field oxide in said isolation regions.

6. The method according to claim 1, further comprising filling said isolation regions with TEOS and polishing said TEOS.

7. The method according to claim 1, wherein said forming of said isolation regions in said substrate comprises:

masking, with a photoresist, over the silicon nitride layer deposited over said oxide layer in regions other than where said isolation regions are to be formed.

8. A method for forming an active area of a semiconductor device, comprising in the following order:

defining isolation regions in a substrate;

forming a pad oxide of a thickness corresponding to a desired threshold voltage of said semiconductor device, said thickness remaining after removing a nitride layer and selectively etching said pad oxide layer of an oxide/nitride mask stack to said thickness, and using said pad oxide of said thickness as a screen layer for forming well implants in said substrate; and forming a gate oxide over said substrate, following said forming well implants, without using a sacrificial oxide.

9. The method according to claim 8, wherein said defining isolation regions comprises forming said isolation regions prior to said forming well implants.

10. The method according to claim 8, wherein said isolation regions comprise field oxide isolation regions.

11. The method according to claim 8, further comprising growing a field oxide in said isolation regions.

12. The method according to claim 8, further comprising filling said isolation regions with TEOS and polishing said isolation regions.

13. A method for forming an active area of a semiconductor device, comprising in the following order:

forming a pad oxide of a thickness corresponding to a desired threshold voltage of said semiconductor device, said thickness remaining after removing a film layer and selectively etching said oxide layer of an oxide/film mask stack to said thickness, and using said pad oxide of said thickness as a screen layer for forming well implants in said substrate; and forming a gate oxide over said substrate, following defining said well implants, without using a sacrificial oxide.

14. The method according to claim 13, wherein said removing a film layer is performed across the entirety of said pad oxide in a single process.

15. The method according to claim 1, wherein said oxide layer is initially formed having a thickness of between about 40 Å and 100 Å.

16. The method according to claim 6, wherein said TEOS is substantially devoid of an exposed seam.

17. The method according to claim 1, wherein a degree of ion implantation during a well implantation is used to control a threshold voltage of said device.

18. The method according to claim 1, wherein after removing said oxide layer, said substrate at an upper corner of said isolation regions is rounded.

19. The method according to claim 1, wherein after removing said oxide layer, said isolation regions are devoid of angled upper corners.

20. The method according to claim 1, wherein said gate oxide layer has a uniform thickness over a surface of said substrate.

* * * * *